US009263151B2

(12) United States Patent
Xanthopoulos et al.

(10) Patent No.: US 9,263,151 B2
(45) Date of Patent: Feb. 16, 2016

(54) MEMORY INTERFACE WITH SELECTABLE EVALUATION MODES

(75) Inventors: Thucydides Xanthopoulos, Watertown, MA (US); David Lin, Westborough, MA (US)

(73) Assignee: Cavium, Inc., San Jose, CA (US)

( * ) Notice: Subject to any disclaimer, the term of this patent is extended or adjusted under 35 U.S.C. 154(b) by 211 days.

(21) Appl. No.: 13/396,824

(22) Filed: Feb. 15, 2012

(65) Prior Publication Data

US 2012/0210179 A1 Aug. 16, 2012

Related U.S. Application Data

(60) Provisional application No. 61/442,970, filed on Feb. 15, 2011.

(51) Int. Cl.

*G11C 29/00* (2006.01)
*G11C 29/02* (2006.01)
*G06F 11/27* (2006.01)
*G11C 29/48* (2006.01)

(52) U.S. Cl.

CPC ................ *G11C 29/02* (2013.01); *G06F 11/27* (2013.01); *G11C 29/022* (2013.01); *G11C 29/48* (2013.01)

(58) Field of Classification Search

CPC ........ G06F 11/27; G11C 29/022; G11C 9/48; G11C 29/02; G11C 29/56; G11C 29/48; G11C 29/44; G11C 29/50; H05K 999/99

See application file for complete search history.

(56) References Cited

U.S. PATENT DOCUMENTS

| | | | | |
|---|---|---|---|---|
| 4,620,302 | A * | 10/1986 | Binoeder et al. | 714/700 |
| 5,185,736 | A * | 2/1993 | Tyrrell et al. | 370/358 |
| 5,574,692 | A * | 11/1996 | Dierke | 365/201 |
| 5,930,814 | A * | 7/1999 | Lepejian et al. | 711/1 |
| 5,995,731 | A * | 11/1999 | Crouch et al. | 716/136 |
| 6,115,833 | A * | 9/2000 | Sato et al. | 714/718 |
| 6,158,029 | A * | 12/2000 | Richter et al. | 714/718 |
| 6,671,847 | B1 | 12/2003 | Chao et al. | |
| 6,760,873 | B1 * | 7/2004 | Hao et al. | 714/724 |
| 6,898,139 | B2 * | 5/2005 | Lee et al. | 365/221 |
| 6,996,760 | B2 * | 2/2006 | Dorsey | 714/733 |
| 7,502,977 | B2 * | 3/2009 | Venkatraman et al. | 714/718 |
| 7,657,807 | B1 * | 2/2010 | Watkins et al. | 714/727 |

(Continued)

OTHER PUBLICATIONS

International Search Report and Written Opinion of the International Searching Authority, PCT/US2012/025163, mailed Jun. 8, 2012.

(Continued)

*Primary Examiner* — Albert Decady
*Assistant Examiner* — Enamul M Kabir
(74) *Attorney, Agent, or Firm* — Hamilton, Brook, Smith & Reynolds, P.C.

(57) ABSTRACT

A memory interface enables AC characterization under test conditions without requiring the use of Automated Test Equipment (ATE) and functional patterns. The memory controller may be configured to generate output patterns through the test interface and create a loopback path for input specification testing using an external stressed-eye random number generator and checker. As a result, the memory interface may be evaluated for electrical and timing specifications under a relatively simple test setup and test procedure through the test interface (JTAG), as opposed to a complex processor program that sets up a similar memory access pattern on Automated Test Equipment (ATE).

12 Claims, 5 Drawing Sheets

CONTROLLER
MEMORY
DATA FROM CONTROLLER
TX
DQ
DATA FROM MEMORY
DATA TO CONTROLLER
Q D
RX
DATA TO MEMORY
D Q
90 DEG.SHIFT
CLOCK FROM CONTROLLER
DQS
CLOCK FROM MEMORY

(56) References Cited

U.S. PATENT DOCUMENTS

| | | | | |
|---|---|---|---|---|
| 7,948,808 | B2 * | 5/2011 | Ko | 365/189.05 |
| 2003/0223294 | A1 * | 12/2003 | Roohparvar | 365/201 |
| 2004/0188853 | A1 * | 9/2004 | Motomochi | 257/777 |
| 2004/0267479 | A1 * | 12/2004 | Querbach et al. | 702/117 |
| 2006/0059397 | A1 * | 3/2006 | Brox et al. | 714/736 |
| 2006/0176943 | A1 * | 8/2006 | Sindalovsky et al. | 375/225 |
| 2007/0104111 | A1 | 5/2007 | Kakizawa | |
| 2007/0164728 | A1 * | 7/2007 | Muljono | 324/158.1 |
| 2007/0291830 | A1 * | 12/2007 | Hori | 375/220 |
| 2011/0004793 | A1 * | 1/2011 | Sul et al. | 714/718 |
| 2012/0204069 | A1 * | 8/2012 | Hughes | 714/718 |

OTHER PUBLICATIONS

International Preliminary Report on Patentability, PCT/US2012/025163, mailed Aug. 29, 2013.

* cited by examiner

MEMORY CONTROLLER OUTPUT WAVEFORMS

MEMORY OUTPUT WAVEFORMS

MEMORY INTERFACE WITH SELECTABLE EVALUATION MODES

RELATED APPLICATION(S)

This application claims the benefit of U.S. Provisional Application No. 61/442,970, filed on Feb. 15, 2011. The entire teachings of the above application(s) are incorporated herein by reference.

BACKGROUND

Semiconductor vendors are responsible for validating all specifications listed in their datasheets either through production testing or through characterization. Production testing means that all parts shipped are tested against all specifications in the product datasheet. Characterization is employed when production testing is not possible or not economically feasible. Characterization means that a collection of parts (around 10) are selected from skewed lots that represent process variation and are subjected to bench characterization of the above specs across voltage and temperature. A report is generated at the end which is typically available to customers. The report shows that all table specifications are met across PVT.

SUMMARY

Embodiments of the present invention provide a memory interface that enables AC characterization under test conditions without requiring the use of automated test equipment (ATE) and functional patterns. The memory controller may be configured to generate output patterns through the test interface and create a loopback path for input specification testing using an external stressed-eye random number generator and checker. As a result, the memory interface may be evaluated for electrical and timing specifications under a relatively simple test setup and test procedure through the test interface (JTAG), as opposed to a complex processor program that sets up a similar memory access pattern on Automated Test Equipment (ATE).

Example embodiments of the invention include a memory controller circuit that provides for testing and verifying the operation of the circuit. The memory controller circuit may include a pattern generator circuit configured to output a predetermined pattern signal. A flip-flop latches a received data signal at a first terminal of the memory controller circuit, and, in response, outputs a looped-back latched data signal. Further, a multiplexer selects among the pattern signal, the looped-back latched data signal, and a data output signal for output at a second terminal of the memory controller.

In further embodiments, the multiplexer selects the pattern signal in a first mode of operation, and selects the looped-back latched data signal in a second mode of operation. The memory controller may be connected to a test load on a PCB at the first terminal, and the test mode may include a resistor and a capacitor connected in series. The memory controller may further include a third terminal, which alternates between an operating as an output terminal during a WRITE operation and operating as an input terminal during a READ operation. In such a configuration, the memory controller may be connected to an oscilloscope at the second and third terminals in the first mode of operation. In the second mode, the memory controller may be connected to a BERTScope at the first, second and third terminal.

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

The drawings are not necessarily to scale, emphasis instead being placed upon illustrating embodiments of the present invention.

DETAILED DESCRIPTION

Figure 1:
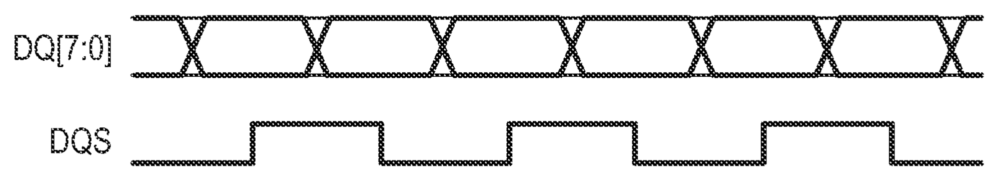
FIG. 1 is a timing diagram of a memory controller output.

A description of example embodiments of the invention follows.

The following terms, defined below, are used throughout the specification:

DDR: Double Data Rate.

DDR2: Memory interface specification running from 400-800 MHz.

DDR3: Memory interface specification running from 667-2133 MHz.

ATE: Automated Test Equipment.

Patterns: ATE Test Program.

Structured Patterns: ATE Test program that stimulates the chip in a mode that won't be used in operation, simply to verify correctness or measure electrical specifications.

Functional Patterns: ATE Test program that stimulates the chip in a mode identical to full operational mode. Functional patterns are much harder to design than structured patterns.

PCB: Printed Circuit Board.

JTAG: Joint Test Action Group. Standardized test interface found on all semiconductor chips.

DUT: Device Under Test. The semiconductor chip undergoing test and characterization.

BERTScope: Specialized laboratory instrument that can generate a high speed bitstream and a clock that can be used as stimulus to semiconductor chips. It can also receive a high speed bitstream and ensure bit correctness by comparing it to preprogrammed patterns. It can also change the timing relationship between the output bitstream and the clock in order to "stress-test" the DUT.

PVT: Process-Voltage-Temperature. Denotes specified operating range of a semiconductor device. Testing and/or characterization must guarantee that a semiconductor device will meet all published specifications across Process (manufacturing uncertainties), supply voltage and ambient or case temperature (PVT).

Skewed Lots Groups of silicon wafers intentionally processed slightly differently by the semiconductor foundry. The purpose of such lots is to provide the chip vendor with a small microchips that capture the entire amount of variation expected to be observed in production quantities.

Semiconductor vendors are responsible for validating all specifications listed in their datasheets either through production testing or through characterization. Production testing means that all parts shipped are tested against all specifications in the product datasheet. Characterization is employed when production testing is not possible or not economically feasible. Characterization means that a collection of parts (around 10) are selected from skewed lots that represent process variation and are subjected to bench characterization of the above specs across voltage and temperature. A report is generated at the end which is typically available to customers. The report shows that all table specifications are met across PVT.

Typically, semiconductor vendors characterize their memory interface using large testers (ATE) that have the capability of measuring timing differences between received pulses and also generating stimulus pulses with precise timing differences. There are 2 problems with this approach:

1. As memory interfaces speed up, ATE equipment cannot generate high timing resolution pulses in order to stress-test the memory interface.
2. ATE needs a method to know whether the test has passed or failed. If the chip does not have special test circuitry, the only way to achieve this is for the ATE to emulate the behavior of a memory chip and run a functional test pattern. Such a pattern that stresses the interface can be impossible to produce due to multiple clock domain interactions in today's highly complex and highly functional chips.

Embodiments of the present invention address problems 1 and 2 above by adding circuitry that will enable a structured (non-functional) test for the memory interface, and adding a loopback signal path that will enable an external instrument (BERTScope) to test input specifications.

Example embodiments described below enable memory interface (DDR2/DDR3) AC characterization in the lab without requiring the use of an ATE and functional patterns. This approach requires new features and capabilities in the memory controller. DDR2/3 characterization is very often delegated to ATE and cannot be done at speed due to equipment limitations.

A memory controller in an example embodiment enables DDR2/3 characterization under test conditions. The memory controller may implement additional on-chip circuitry for such test purposes, as well as a PCB board adapted for evaluation of the memory interface. Output specifications may be measured on dedicated test loads included on the characterization board using a high performance oscilloscope, while the interface transmits a random (or fixed) pattern enabled through JTAG. Input specifications may be computed using the BERTScope with a portion of the interface being in a loopback configuration.

FIG. 1 is a timing diagram of a memory controller output. Memory interface signals are organized in groups of 8 bits (bytes) along with a strobe. These signals are bidirectional. The bit (data) signals are called DQ bits and the strobe signal is called DQS. During a write operation, the memory controller is driving the DQ and DQS signals. The DQ signals contain the data to be written into the memory and the DQS signal is a clock that has a 90-degree phase relationship with the data. This timing relationship is shown in FIG. 1.

Figure 2:
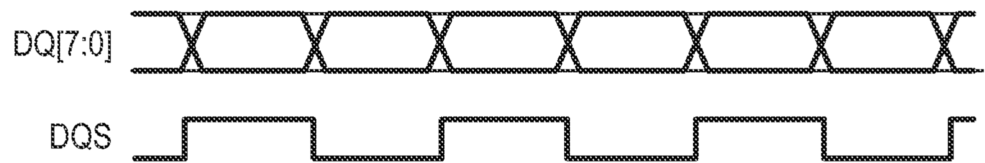
FIG. 2 is a timing diagram of a memory output.

FIG. 2 is a timing diagram of a memory output. The memory chip receives the DQ signal and uses DQS to clock them into a group of flip-flops and then stores them into the memory array. During a read operation, the memory chip drives the DQ signals to the controller and also the DQS strobe. The controller uses the strobe to clock the signals into a group of flip-flops before using them as appropriate in its own clock domain. The memory drives DQ and DQS in phase as shown in FIG. 2. The controller is responsible for delaying DQS by 90-degrees so that it guarantees an optimum setup and hold time margin at the inputs of the receiving flip-flop.

Figure 3:
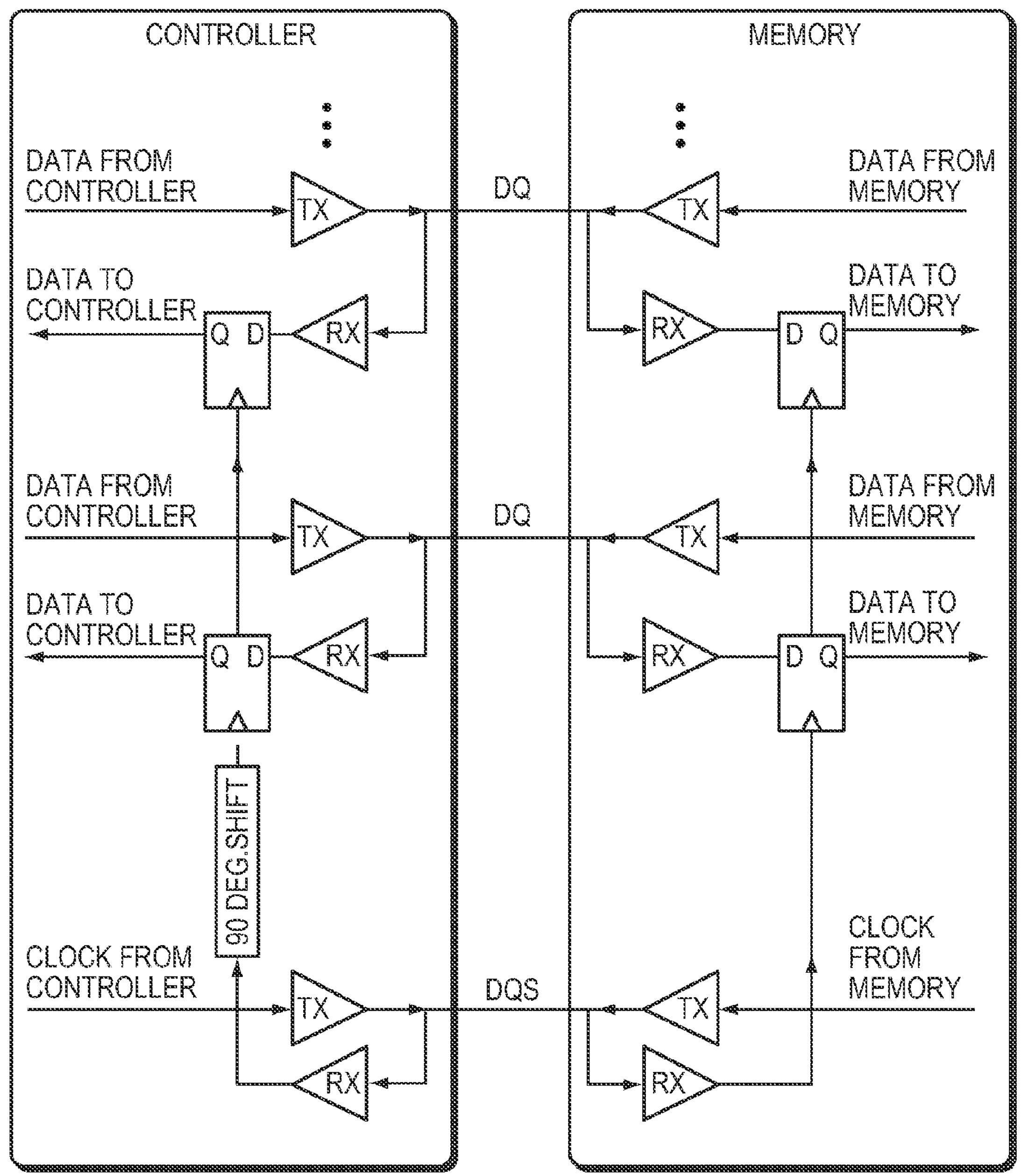
FIG. 3 is a circuit diagram of a typical memory interface.

FIG. 3 is a circuit diagram of a typical memory interface. During a WRITE operation, the TX (transmit) portion of the controller I/Os (inputs/outputs) and the RX (receive) portion of the memory I/Os are engaged. The controller drives data (8 bits) and strobe (1 bit) to the memory 90-degrees out of phase as shown in FIG. 1. The memory uses the strobe to latch the data in the flip-flops that follow the RX receiver in FIG. 3. Then, the data is forwarded to the memory array for storage.

During a READ operation, the RX portion of the controller I/Os and the TX portion of the memory I/Os are engaged. The memory drives data (8 bits) and strobe (1 bit) to the controller in-phase as shown in FIG. 2. The controller delays the strobe by 90 degrees using the 90-degree phase-shift block shown in FIG. 3. The data is latched by the delayed strobe in the flip-flops that follow the RX receiver in the controller shown in FIG. 3.

Figure 4:
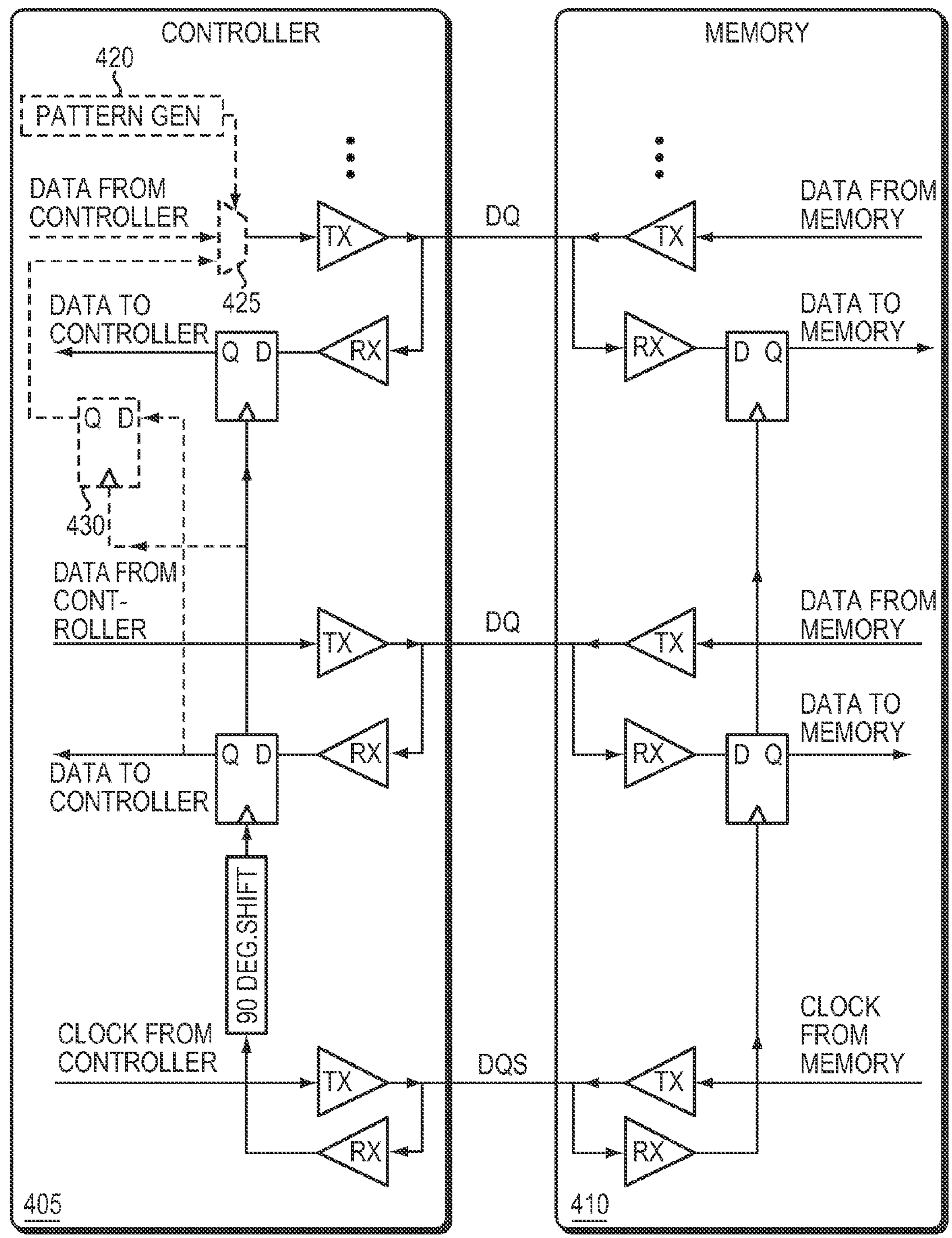
FIG. 4 is a circuit diagram of a memory interface in an example embodiment.

FIG. 4 is a circuit diagram of a memory interface in an example embodiment. The memory controller 405 shown in FIG. 4, interfacing with the memory device 410, may include components found in the controller described above with reference to FIG. 3, and further includes the following components:

1. A pattern generator 420 selectably generating patterns including be constant 1, constant 0, clock-like, PRBS.
2. A 3-way multiplexer 425.
3. An additional flop 430 through which the received signal from an adjacent bit can be fed to the output section of a bit and transmitted off-chip.

The above components serve a number of purposes when the controller is tested in a standalone configuration. In particular, two modes of operation may be selected for evaluating the memory controller. These modes may be accessed or initiated via the controller test interface (JTAG). For example, a Personal Computer (PC) with an appropriate peripheral (JTAG probe) can be connected to such interface and software running on such computer can engage the two modes of operation.

Figure 5:
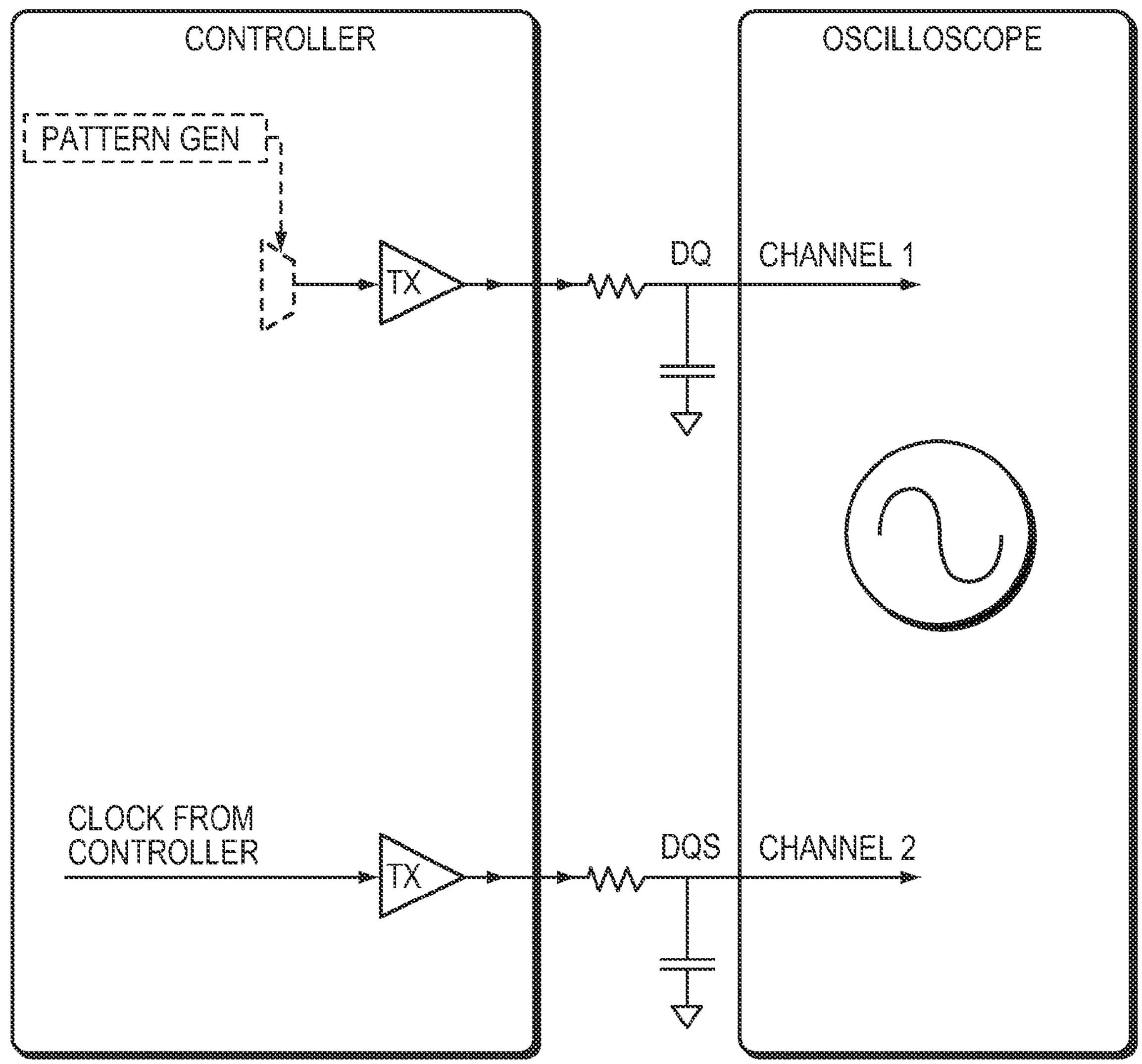
FIG. 5 is a block diagram a memory interface in a first test configuration.

FIG. 5 is a block diagram of memory interface of FIG. 4 in a first test configuration. In this first mode of operation, for measuring controller output specifications, the pattern generator sends a random pattern on all (or a selected set of) output DQ bits. This will enable the user to measure output specifications (phase relationship between DQ and DQS) with a bench oscilloscope. Power can also be measured as well as the effects of simultaneously switching output noise. This first mode of operation is advantageous in testing for all such specifications because the pattern generator can be easily driven from the test interface as opposed to requiring a user to write a program that will generate a similar memory access pattern. Although the interface shown in FIG. 5 may include all of the circuitry illustrated in FIG. 4, only the circuitry used in the first mode of operation is shown in FIG. 5.

Figure 6:
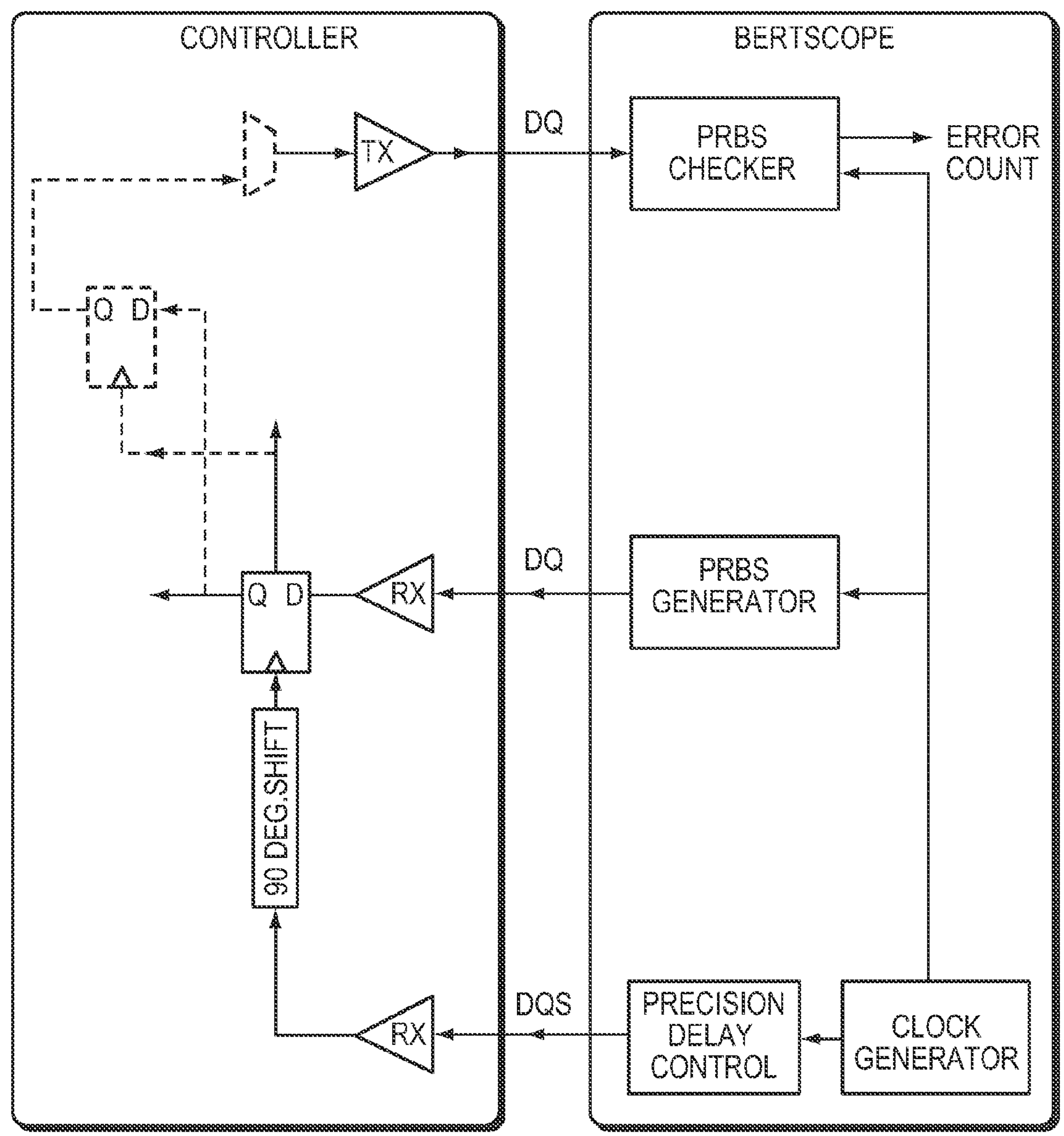
FIG. 6 is a block diagram of a memory interface in a second test configuration.

FIG. 6 is a block diagram of a memory interface in a second test configuration. In the second mode of operation, for measuring controller input specifications, a BERTScope is connected to the DQ (input), DQ (output), DQS (input) while the loopback multiplexer setting is selected, and by varying the relative phase of the incoming DQ and DQS, very precise measurements of input specifications such as setup, hold, receiver sensitivity can be measured. The pass or fail condition will be whether the BERTScope receives back the same pattern that it is transmitting. If the BERTScope does not receive the same pattern, it increments an error counter monitored by the user. A non-zero value in the error counter indicates that the controller receiver specification is exceeded. In this fashion, after a few experiments the user can determine the phase shift between DQ and DQS that can be tolerated by the receiver and determine its setup and hold time. In a very similar experiment, the signal amplitude of the BERTScope output can be changed and the user can determine the minimum signal amplitude that can be reliably received by the controller. This is also a very important specification called controller receiver sensitivity. This experimental setup is shown in FIG. 6. Again, only relevant circuitry to this mode of operation is shown.

Circuitry for enabling and simplifying memory interface characterization has been presented. This circuitry involves minimal additional components to the memory controller for generation of output patterns through the test interface and creating a loopback path for input specification testing using an external stressed-eye random number generator and checker. In contrast to typical testing methods, the circuitry provides a simpler and more effective way to characterize the electrical and timing specifications of a memory interface because it involves a simple setup and procedure through the test interface (JTAG), as opposed to a complex processor program that sets up a similar memory access pattern on Automated Test Equipment (ATE).

While this invention has been particularly shown and described with references to example embodiments thereof, it will be understood by those skilled in the art that various changes in form and details may be made therein without departing from the scope of the invention encompassed by the appended claims.

What is claimed is:

1. A memory controller circuit comprising:

a pattern generator circuit configured to output a predetermined pattern signal;

a flip-flop configured to latch a received data signal at a first terminal of the memory controller circuit and output a looped-back latched data signal; and a multiplexer configured to select among the pattern signal in a first mode of operation, the looped-back latched data signal in a second mode of operation, and a data output signal in a third mode of operation for output at a second terminal of the memory controller, the second terminal being connected to an external testing device in at least one of the first and second modes of operation and a memory device in the third mode of operation.

2. The circuit of claim 1, wherein the memory controller is connected to a test load on a printed circuit board (PCB) at the first terminal.

3. The circuit of claim 2, wherein the test load includes a resistor and a capacitor connected in series.

4. The circuit of claim 2, wherein the memory controller further includes a third terminal, the third terminal alternating between operating as an output terminal during a WRITE operation and operating as an input terminal during a READ operation in the third mode of operation.

5. The circuit of claim 4, wherein the memory controller is connected to an oscilloscope at the second and third terminals in the first mode of operation, the testing device including the oscilloscope.

6. The circuit of claim 4, wherein the memory controller is connected to a BERTScope at the first, second and third terminal in the second mode of operation, the testing device including the BERTScope.

7. A method of testing a memory controller circuit comprising:

generating, at the memory controller circuit, a predetermined pattern signal;

latching, at the memory controller circuit, a received data signal at a first terminal of the memory controller circuit and outputting a looped-back latched data signal; and selecting among the pattern signal in a first mode of operation, the looped-back latched data signal in a second mode of operation, and a data output signal in a third mode of operation for output at a second terminal of the memory controller, the second terminal being connected to an external testing device in the first and second modes of operation and a memory device in the third mode of operation.

8. The method of claim 7, wherein the memory controller is connected to a test load on a printed circuit board (PCB) at the first terminal.

9. The method of claim 8, wherein the test load includes a resistor and a capacitor connected in series.

10. The method of claim 8, wherein the memory controller further includes a third terminal, the third terminal alternating between operating as an output terminal during a WRITE operation and operating as an input terminal during a READ operation in the third mode of operation.

11. The method of claim 10, further comprising connecting the memory controller to an oscilloscope at the second and third terminals in the first mode of operation, the testing device including the oscilloscope.

12. The method of claim 10, further comprising connecting the memory controller to a BERTScope at the first, second and third terminal in the second mode of operation, the testing device including the BERTScope.

* * * * *